US 11,756,993 B2

(12) United States Patent
Bobde et al.

(10) Patent No.: US 11,756,993 B2
(45) Date of Patent: Sep. 12, 2023

(54) IGBT LIGHT LOAD EFFICIENCY

(71) Applicant: Alpha and Omega Semiconductor (Cayman) Ltd., Grand Cayman (KY)

(72) Inventors: Madhur Bobde, Sunnyvale, CA (US); Lingpeng Guan, San Jose, CA (US); Karthik Padmanabhan, San Jose, CA (US); Bum-Seok Suh, Seoul (KR)

(73) Assignee: Alpha and Omega Semiconductor (Cayman) Ltd., Grand Cayman (KY)

(*) Notice: Subject to any disclaimer, the term of this patent is extended or adjusted under 35 U.S.C. 154(b) by 0 days.

(21) Appl. No.: 17/736,329

(22) Filed: May 4, 2022

(65) Prior Publication Data

US 2022/0262898 A1    Aug. 18, 2022

Related U.S. Application Data

(63) Continuation of application No. 16/585,388, filed on Sep. 27, 2019, now Pat. No. 11,342,410.

(51) Int. Cl.
| | | |
|---|---|---|
| *H01L 29/06* | (2006.01) | |
| *H01L 29/739* | (2006.01) | |
| *H01L 29/10* | (2006.01) | |
| *H01L 27/06* | (2006.01) | |

(52) U.S. Cl.
CPC ...... *H01L 29/0634* (2013.01); *H01L 27/0664* (2013.01); *H01L 29/1095* (2013.01); *H01L 29/7395* (2013.01)

(58) Field of Classification Search
CPC ............. H01L 29/0634; H01L 27/0664; H01L 29/1095; H01L 29/7395
See application file for complete search history.

(56) References Cited

U.S. PATENT DOCUMENTS

| | | |
|---|---|---|
| 7,476,931 B2 | 1/2009 | Schmidt |
| 7,951,676 B2 | 5/2011 | Schmidt |
| 8,569,780 B2 | 10/2013 | Hsieh |
| 8,643,025 B2 | 2/2014 | Nakayama |
| 8,841,721 B2 | 9/2014 | Yen et al. |
| 8,896,131 B2 | 11/2014 | Bhalla et al. |
| 9,559,171 B2 | 1/2017 | Naito et al. |
| 9,881,916 B2 | 1/2018 | Naito et al. |
| 9,905,555 B2 | 2/2018 | Naito et al. |
| 10,050,105 B2 | 8/2018 | Shirakawa et al. |
| 10,236,677 B2 | 3/2019 | Naito et al. |
| 10,931,276 B1 | 2/2021 | Suh et al. |
| 2007/0273345 A1 | 11/2007 | Chen et al. |
| 2008/0173969 A1 | 7/2008 | Hebert et al. |
| 2012/0223667 A1 | 9/2012 | Wang et al. |
| 2013/0049654 A1 | 2/2013 | Kure |
| 2014/0085760 A1 | 3/2014 | Lui |

(Continued)

OTHER PUBLICATIONS

"Power MOSFET Basics" Alpha and Omega Semiconductor. Accessed Aug. 22, 2019.

(Continued)

*Primary Examiner* — Latanya N Crawford Eason
(74) *Attorney, Agent, or Firm* — JDI PATENT; Joshua D. Isenberg; Robert Pullman

(57) ABSTRACT

An apparatus comprising an insulated gate bipolar transistor and a super junction metal-oxide semiconductor field effect transistor wherein the insulated gate bipolar transistor and the super-junction metal-oxide semiconductor field effect transistor are electrically and optionally structurally coupled.

16 Claims, 6 Drawing Sheets

(56) References Cited

U.S. PATENT DOCUMENTS

| | | |
|---|---|---|
| 2015/0061003 A1 | 3/2015 | Zundel |
| 2016/0111419 A1 | 4/2016 | Naito et al. |
| 2017/0047319 A1 | 2/2017 | Naito et al. |
| 2017/0047320 A1 | 2/2017 | Naito et al. |
| 2017/0077272 A1 | 3/2017 | Kubo |
| 2018/0269871 A1 | 9/2018 | Basler et al. |
| 2018/0309438 A1 | 10/2018 | Matsuda et al. |
| 2020/0312955 A1 | 10/2020 | Kubo |

OTHER PUBLICATIONS

Jonathan Dodge et al, "IGBT Tutorial", Application Note APT0201 Rev. B, Jul. 1, 2002, Advanced Power Technology, Bend, OR.
Non-Final Office Action for U.S. Appl. No. 16/585,388, dated Aug. 5, 2021.
Notice of Allowance for U.S. Appl. No. 16/585,388, dated Feb. 2, 2022.
Notice of Allowance for U.S. Appl. No. 16/585,437, dated Oct. 7, 2020.
U.S. Appl. No. 16/585,437 to Bum-Seok Suh et al. filed Sep. 27, 2019.

IGBT LIGHT LOAD EFFICIENCY

CLAIM OF PRIORITY

This application is a continuation of U.S. patent application Ser. No. 16/585,388 filed Sep. 27, 2019, the entire contents of which are incorporated herein by reference.

FIELD OF THE INVENTION

Aspects of the present disclosure generally relate to transistors and more particularly to insulated gate bipolar transistors.

BACKGROUND OF THE INVENTION

A variety of modern applications use electronic switches to perform different functions during operation. While there are many different types of electronic switches including relays, transistors and vacuum tubes. Currently solid-state transistors are predominantly used in electronic circuits today. Two major types of transistors are Insulated Gate Bipolar Transistors (IGBTs) and metal-oxide semiconductor field effect transistors (MOSFETs).

IGBTs have excellent high current conductance attributes compared to MOSFETs. The 'on' state conductance of a MOSFET is linear at a standard temperature and can be modeled as a resistor using RDSon. On the other hand, the conductance of an IGBT at a standard temperature is non-linear and is better modeled as diode. Additionally IGBTs are superior in handling higher current densities compared to MOSFETs and also have a significantly simpler/lower cost fabrication process compared to a Super-Junction MOSFET. Thus, IGBTs are ideal for high current application because of their relatively reduced resistance and relative reduced cost.

While there are many positive characteristics of IGBTs compared to MOSFETS, there are also some significant drawbacks. One drawback is that IGBTs at low current have an 'on' state voltage threshold $V_{th}$ and do not begin conducting until the voltage is above the threshold. This means that for low amperage and voltage applications traditional IGBTs have significantly higher conduction losses compared to MOSFETs, which begin conducting in the 'on' state at a non-zero voltage without any diode knee in their output characteristics. Another drawback of the IGBT is that due to its construction, it does not conduct current in the reverse current direction whereas MOSFETs have a built-in body diode that allows reverse current direction conduction.

To overcome this problem a diode may be placed antiparallel to the IGBT commonly referred to as a freewheeling diode. Freewheeling diodes resolve the problem of reverse current direction conduction but do nothing to solve the voltage threshold issue. Thus, it would advantageous to configure an IGBT package that could conduct at low amperages and have good reverse current conduction characteristics.

It is within this context that aspects of the present disclosure arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. that are within the recited limits.

In the following discussion of the illustrated examples, the first conductivity type is typically N and the second conductivity type is P. However, it should be noted that substantially similar devices may be fabricated using a similar process but with conductivity types opposite those shown and described. Specifically, aspects of the present disclosure include implementations like those shown and described herein in which N is substituted for P and vice versa.

IGBTs generally have better high amperage conductance characteristics than MOSFETs. IGBT's generally are constructed similar to MOSFETS except they have an extra doped layer. Thus where a MOSFET may have a doping organization of N-doped layer, P-doped layer, N-doped layer. An IGBT will have a doping organization of P, N, P, N or N, P, N. P.

Figure 1:
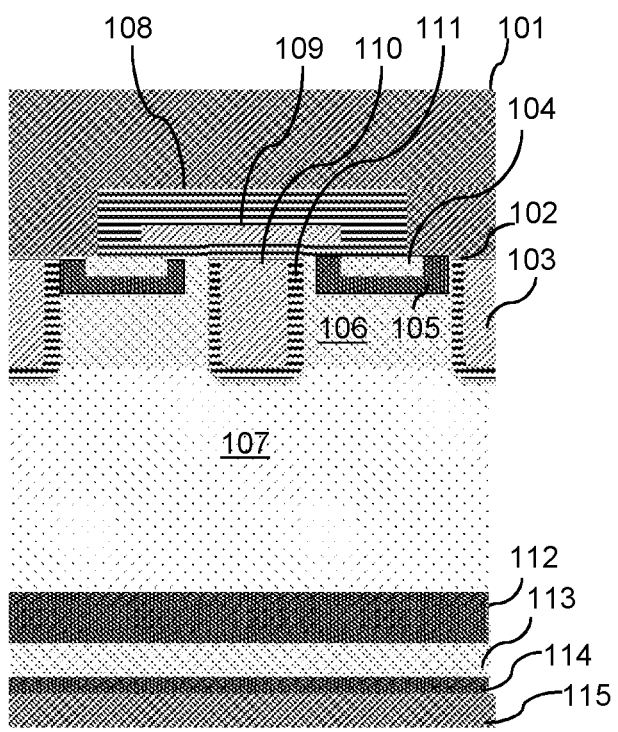
FIG. 1 is a schematic diagram of a prior art IGBT without a freewheeling diode.

FIG. 1 shows a prior art layer configuration of an IGBT. As shown the IGBT has a lightly doped drift region of a first conductivity type (e.g. N-doped) 107. The doping concentration of the drift region may be between 1e13 $cm^{-3}$ and 5e14 $cm^{-3}$ depending on the desired breakdown voltage. Lower doping concentrations of the drift region result in higher breakdown voltages. A more heavily doped buffer region of the first conductivity type 112 underneath the drift region 107. The doping concentration of the buffer can range from 1e15 $cm^{-3}$ to 5e16 $cm^{-3}$. A lightly doped layer 113 of either conductivity type, coming from the starting substrate material exists under the buffer. The doping level of layer 113 is typically below 1e15 cm-3. A heavier doped layer 114 of the second conductivity type is underneath the lightly doped region. The heavier doped layer 114 forms the IGBT collector and can be implanted from backside or from frontside during epitaxial growth. Its doping levels range from 1e17 cm-3 to 1e19 cm-3. A collector contact metallic layer is formed on the bottom of the collector 115.

On top of the lightly doped drift region 107 is a heavily doped region of the first conductivity type 106. A body region 105 is located on top of the heavily doped region. The body region may be doped with the second conductivity type. The body region may be may have a doping concentration in the range of 1e17 $cm^{-3}$ to 1e18 $cm^{-3}$. The body region 105 may have a heavily doped emitter region of the first conductivity type formed on top of it 104. The doping concentration of the source region may be above around 2e19 $cm^{-3}$.

A shield trench may be formed in the substrate and terminate at the depth of the lightly doped drift region 107. The shield trench may be lined with a dielectric (e.g. an oxide layer) 111. A shield trench electrode 110 is disposed on top of the dielectric and may be at emitter voltage. The shield trench electrode may be for example a polycrystalline silicon layer. A planar gate comprising a planar insulating layer (e.g. an oxide layer) 108 and a gate insulating layer 109 is formed on top of the shield electrode and extends over the emitter regions. The gate electrode 109 is formed on top of the gate insulating layer and more insulating layer 108 is formed around the gate electrode to isolate the gate electrode 109 from the emitter metal 101. The gate electrode may be created using for example and without limitation a polycrystalline silicon layer.

As shown, not every shield electrode is covered by a gate. A gate oxide layer and gate electrode do not cover shield trench dielectric 102 and shield trench electrode 103. The shield trenches serve to compensate N+ regions and to keep the breakdown voltage high.

Figure 2:
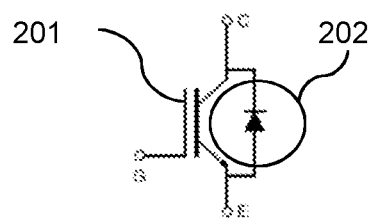
FIG. 2 is a circuit diagram depicting an example of prior art placement of a freewheeling diode in an IGBT.

FIG. 2 shows a circuit diagram of an IGBT 201 and a diode 202. Due to the construction of the IGBT, reversed bias, reverse current does not flow through the IGBT. The IGBT is configured such that current flows from the collector C to the emitter E when a voltage greater than the voltage gate-emitter threshold ($V_{ge(th)}$) is applied to the gate G. A reverse bias applied from to the collector will not result in current being conducted across the IGBT. To overcome this issue prior IGBT circuit designs place a diode 202 antiparallel with the IGBT 201. In the context of the present disclosure, antiparallel means that the device is connected in parallel but configured to conduct when a reverse bias is applied to the collector. Referring the diagram, the anode of the diode 202 is connected to the collector of the IGBT and the cathode of the diode is collected to the emitter of the IGBT.

Figure 3:
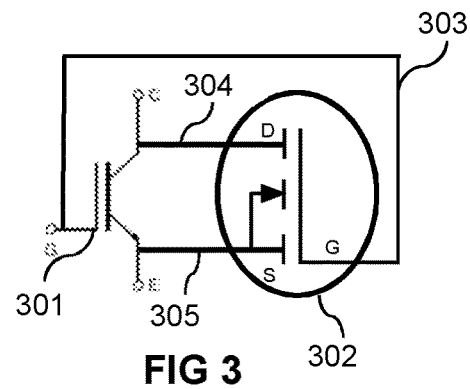
FIG. 3 is a circuit diagram depicting an IGBT coupled to a Super-junction MOSFET according to aspects of the present disclosure.

According to aspects of the present disclosure IGBT, designs may be improved using a super-junction MOSFET arranged in parallel with the IGBT instead of freewheeling diode. FIG. 3 shows an aspect of the present disclosure wherein the IGBT 301 is structurally to a super-junction MOSFET 302. Additionally as shown, the IGBT may be conductively coupled to the super-junction MOSFET by way of sharing the same contact layer. The IGBT depicted is an N-channel IGBT and the super-junction MOSFET shown is an N-channel super-junction MOSFET. The gate G of the IGBT 301 and the gate G of the super-junction MOSFET 302 are conductively coupled 303. The IGBT and the super-junction MOSFET are linked and the $V_{GE(th)}$ for the IGBT and the $V_{GS(th)}$ for the super-junction MOSFET should be within a similar range, e.g., within ±2 volts of each other. Due to the conductive coupling of the gates and the similar activation threshold values for the IGBT and the super-junction MOSFET, when a sufficient voltage is applied to the IGBT to put the device in the 'on' state, the super-junction MOSFET should also be in the 'on' state. The collector C of the IGBT 301 and the drain D of the super-junction MOSFET 302 may also be conductively coupled 304. The emitter E of the IGBT and the source S of the super-junction MOSFET may be conductively coupled 305 as well. The super-junction MOSFET used for this purpose may include a fast recovery body diode which is created by reducing minority carrier lifetime of the super-junction MOSFET using methods such as electron irradiation.

Additionally, the super-junction MOSFET 302 is configured so that when arranged as described the body diode of the super-junction MOSFET is antiparallel with the IGBT. As such during operation in reverse bias and reverse current mode, the body diode of the super-junction MOSFET acts as a freewheeling diode for the IGBT.

As used herein conductively coupled may mean an electrical connection between two elements that allows electrons to flow from one element to the other. The electrical connection may be through any conductive material such as wire, metallic leads, conductive gel, metallized glass, metallized plastic and the like. Structurally coupled may mean that two elements are affixed to each other or to the same structure or surface, where the affixation may be flexible or rigid. The structure or surface may be any surface known in the art for example and without limitation a PCB, an integrated circuit package, a metal surface, a plastic surface, a wooden surface or similar.

Figure 4:
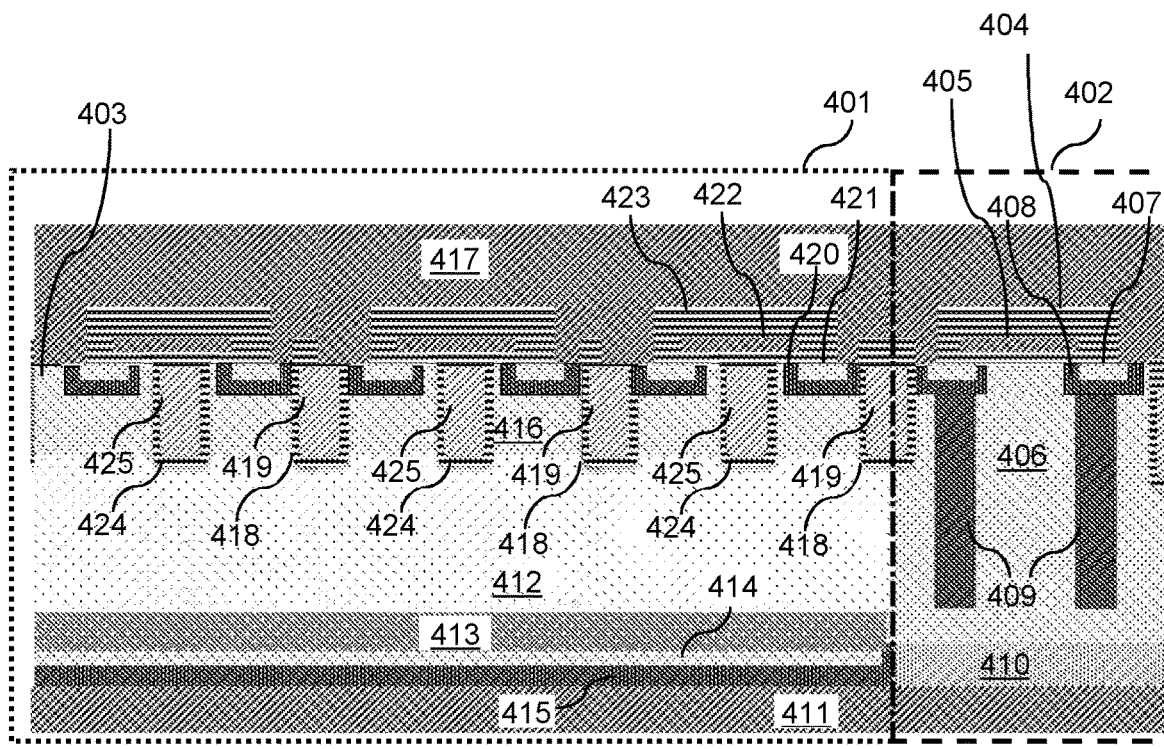
FIG. 4 is a side schematic diagram of an IGBT structurally coupled to a super-junction MOSFET on the same substrate according to aspects of the present disclosure.

FIG. 4 depicts an embodiment of the present disclosure where the IGBT and super-junction MOSFET that are structurally coupled by the same substrate, epitaxial layers and contact layers. As shown, the substrate and epitaxial layers includes both an IGBT 401 and super-junction MOSFET 402. Additionally, the two switches share a contact metal 417 and a substrate contact 411. By way of sharing a contact metal 417 and a substrate contact 411, the IGBT 401 and the Super-junction MOSFET 402 are electrically coupled. As shown the contact metal 417 for the super-junction MOSFET 402 is the source metal contact and is in electrical contact with the Source region 407. The source region may be doped with the first conductivity type and located in the surface of an epitaxial layer 403. A body region 408 of the second conductivity type formed deeper in the epitaxial layer 403 and underneath the source region 407. A doped column of the second conductivity type 409 is located under the body region 408 in the epitaxial layer 403. The range of doping concentrations for the source region 407 and body region 408 may be as discussed above. By way of example, and not by way of limitation, the source doping concentration may be of order 2e19 and the body doping concentration may be of order 1-5e17. $V_{th}$ can be tuned by adjusting body dose and gate oxide thickness.

A drift region of the first conductivity type 406 may be located in the epitaxial layer between the two columns doped with the second conductivity type 409. Above the drift region may be the gate insulator 404, which may be for example and without limitation an oxide layer. A gate electrode 405 is located above the gate insulator 404 and protected from the contact metal 417 by the gate insulator. The gate electrode 405 may be for example and without limitation a polysilicon layer. When a voltage is applied to the gate electrode 405 at or above a voltage threshold ($V_{gs(th)}$) current applied to the drain (For an N-channel MOSFET) at the substrate layer 411 will be conducted vertically through the drift region 406, the body region 408 and source region 407 to the contact metal 417. The drift region 406 and columns 409 are sized and doped such that their charges balance out horizontally with adjacent columns. The concentrations of the columns and drifter region can be made higher than that of just a drift region in a typical transistor so that during the ON state they conduct with lower 'on' resistance. Additionally the $V_{GS(th)}$ of the Super-junction MOSFET 402 should be chosen such that it is the same or within ±2 Volts of the Voltage threshold ($V_{GE(th)}$) for IGBT 401.

Under the drift region 406 is a heavily doped bottom layer 410 of the first conductivity type. Finally, in conductive contact with the layer 410 is the backside contact 411 or drain contact for the super-junction MOSFET. The heavily doped bottom layer may act as the drain for the device with current flowing from the backside contact 411 through the bottom layer 410 and eventually to the contact metal 417.

An IGBT is formed from the same substrate and epitaxial layers 401 as the super-junction MOSFET 402. As shown a shield trench may separate the IGBT 401 from the super-junction MOSFET 402. The shield trench may be lined with a shield trench dielectric 418 which may be made of, without limitation, an oxide layer, as discussed above. A shield trench electrode 419 may be disposed on top the shield trench dielectric 418 and insulated from the epitaxial layer and substrate by the dielectric. The shield trench electrode may be made from a conductive material for example and without limitation, polycrystalline silicon.

The IGBT has a lightly doped epitaxial drift region 412 of a first conductivity type. The doping concentration of this region may be lower than the doping concentration of the Super-junction MOSFET 402. A more heavily doped buffer region 413 of the first conductivity type is formed underneath the epitaxial drift region 412. Under the buffer region 413 is a lightly doped layer 414 of either conductivity type and an implanted bottom layer 415 at the bottom of second conductivity type that forms the IGBT collector. A backside contact 411 is formed on the bottom of the implanted bottom layer 415. The backside contact 411 may be a metal layer, which may be made from copper, aluminum or gold deposited on the back surface.

On top of the lightly doped epitaxial drift region 412 is a heavily doped region 416 of the first conductivity type. A body region 420 is located on top of the heavily doped region. The body region may be doped with the second conductivity type. The body region 420 may have a heavily doped region emitter region 421 of the first conductivity type formed on top of it.

A shield trench may be formed in the substrate and terminate at the depth of the lightly doped epitaxial drift region 412. The shield trench may be lined with a dielectric 424. A shield trench electrode 425 is disposed on top of the dielectric and may be at emitter voltage. A gate comprising a gate insulating layer 423 is formed on top of the shield electrode and extending over the emitter regions. A gate electrode 422 is formed on top of the gate insulating layer and more insulating layer 423 is formed around the gate electrode to isolate the gate electrode 422 from the contact metal 417.

Similar to Super-junction MOSFET 402 the $V_{GE(th)}$ of the IGBT 401 is configured to be within ±2 Volts of the $V_{GS(th)}$ for the Super-junction MOSFET. The implanted bottom layer 415 acts as a collector for the IGBT 401 and when a voltage is applied to the Gate electrodes 422, current at the backside contact 411 flows vertically through the implanted layer 415 and epitaxial layers to the emitter region 421 finally to the contact metal 417.

Figure 5:
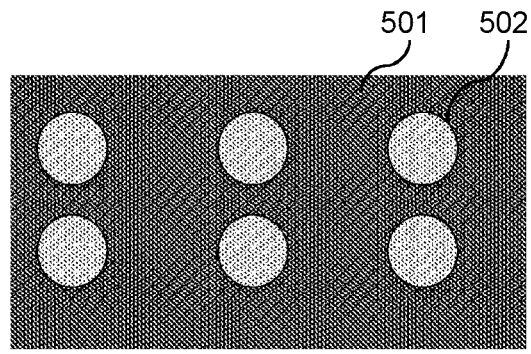
FIG. 5 is a bottom view schematic diagram of an IGBT structurally coupled to a super-junction MOSFET on the same substrate according to aspects of the present disclosure.

FIG. 5 shows a bottom view of the device having an IGBT and Super-junction MOSFET structurally coupled by way of sharing back metal and epitaxial layers. In the shown embodiments, the back side of the chip is being described. In the IGBT portion, the shown region is the collector and in the Super-junction MOSFET, the region is the drain. The majority of the substrate space is occupied by the IGBT, implanted substrate of the second conductivity type 501. The Super-junction MOSFET substrate regions of the first conductivity type 502 are interspersed regularly. In the shown embodiment, the Super-junction MOSFETS are circular regions separated by IGBTs.

Figure 6:
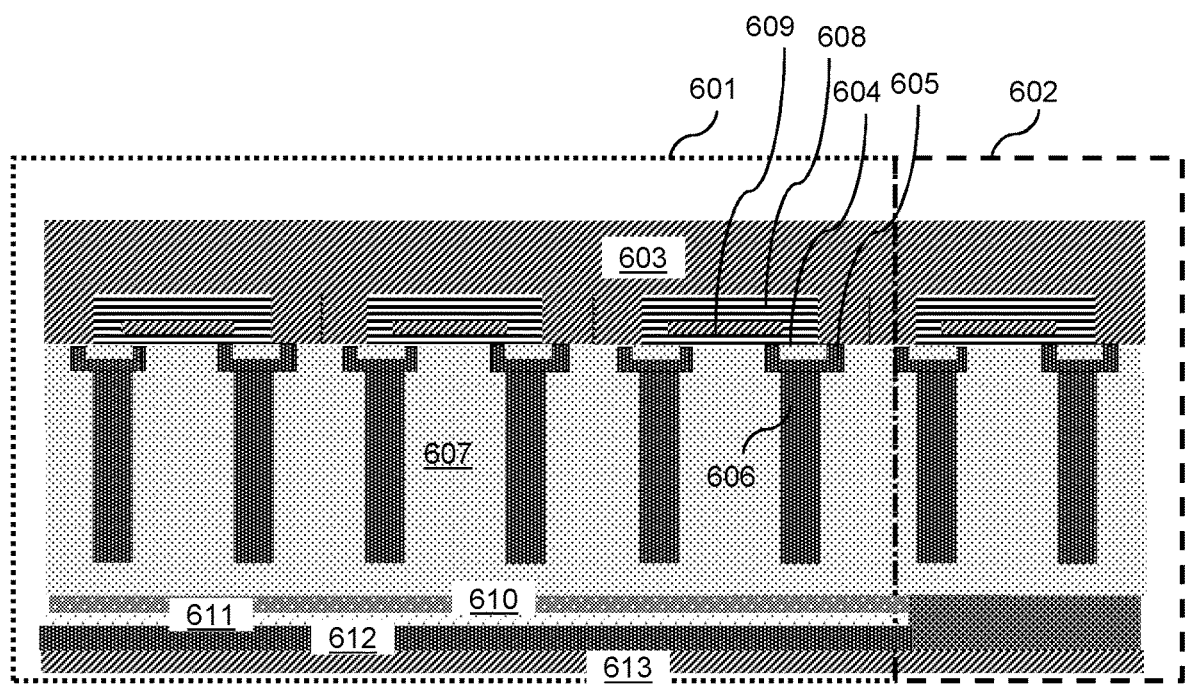
FIG. 6 is a side view of an IGBT structurally coupled to a super-junction MOSFET on the same substrate and having deep super-junction like trenches according to aspects of the present disclosure.

FIG. 6 depicts an alternative embodiment of the present disclosure. In this alternative embodiment, the shield trenches have been eliminated in the IGBT section 601 and Super-junction-like doped columns 606 are created underneath the body regions 605 and extend into the drift region 607. The super-junction-like doped columns may be of the second conductivity type as the body region 605. Compared to the IGBT in FIG. 4, the relative doping concentration of the first conductivity type for the epitaxial/drift region is greater in the alternative embodiment shown in FIG. 6. Additionally the drift region 607 extends all the way to the buffer implant layer 610. Below the buffer is the lightly doped layer 611 of either conductivity type, and the implanted layer 612 of the second conductivity type that forms the IGBT collector.

The IGBT portion 601 also includes a gate insulating layer 608 formed on the epitaxial layer. The gate insulating layer 608 protects the gate electrode 609 from current flowing through epitaxial layer and contact metal 603. The gate insulating layer may be for example and without limitation a silicon oxide layer. The gate electrode 609 is formed on the surface of the gate insulating layer 608 and the insulating layer encompasses the gate electrode to electrically isolate the gate electrode from the metal contact layer 603. The gate electrode may be for example and without limitation a layer of polycrystalline silicon. When a voltage at or exceeding $V_{GE(th)}$ is applied to the gate electrode current flows from the substrate contact layer 611 through a vertical channel formed in the substrate implant region 610, the drift region 607, the body region 605, the emitter layer 604 to the contact metal 603.

The Super-junction portion 602 is largely unchanged from the portion described in FIG. 4. It should be noted that in this embodiment the Super-junction portion 602 and the IGBT portion 601 share a drift region 607. The shared epitaxial/drift region may be at the same doping concentration for both the super-junction portion 602 and the IGBT portion 601.

Figure 7:
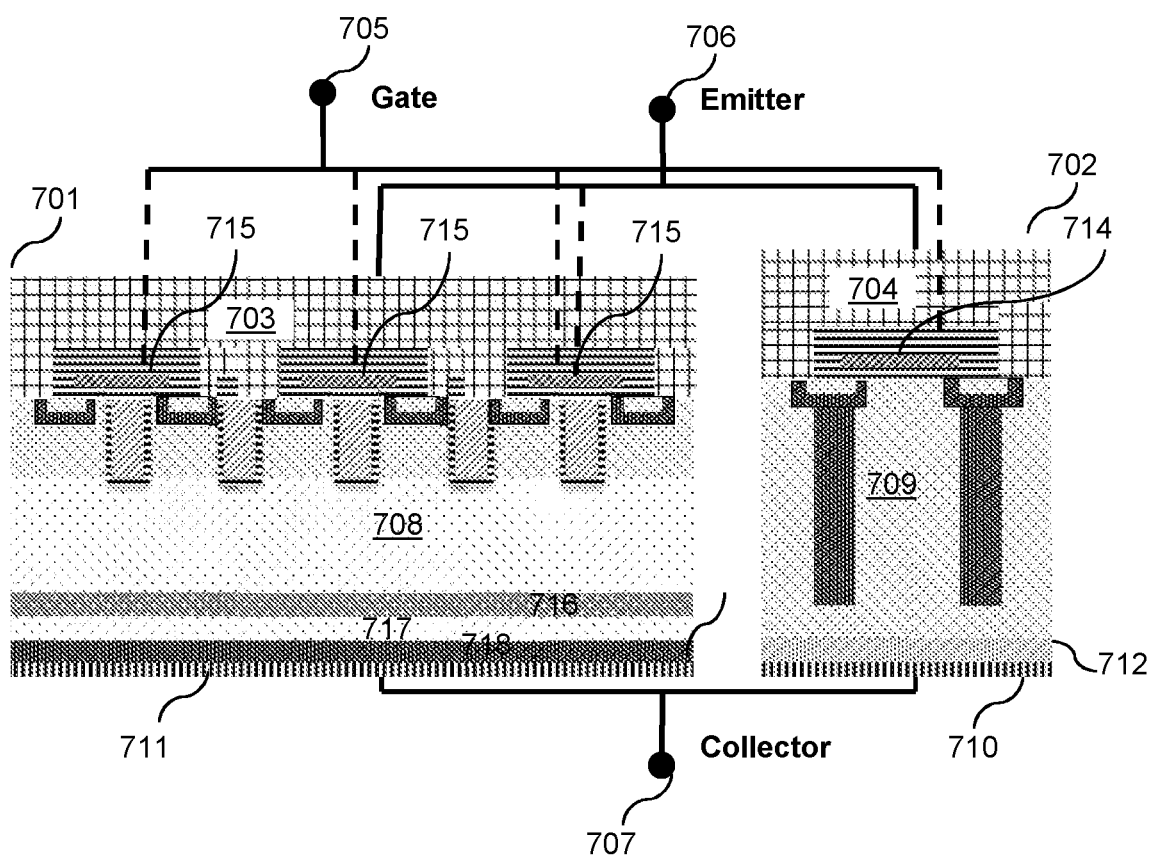
FIG. 7 is a side view of an IGBT having emitter and collector conductively coupled to the source and drain of a super-junction MOSFET, respectively, according to aspects of the present disclosure.

FIG. 7 depicts another alternative embodiment according to aspects of the present disclosure. Here, the IGBT 701 and the super-junction MOSFET 702 are physically separate but structurally coupled by way of electrical connections between the gate electrodes, and contacts. As shown, the construction of the IGBT portion 701 and Super-junction MOSFET 702 is similar to that of FIG. 4. Unlike the embodiments shown in FIGS. 4 and 6, the IGBT portion has a separate emitter contact metal layer 703, drift region 708, buffer 716, lightly doped region of either conductivity type 717 and implanted layer of second conductivity type 718 that forms IGBT collector and collector contact 711. Likewise, the super-junction MOSFET includes a separate source contact metal layer 704, epitaxial/drift region 709, substrate layer 712 and drain contact 710.

The operation of the two portions shown is similar to the previous embodiments because the gate electrode of the super-junction MOSFET portion 714 is electrically coupled to the gate electrodes of the IGBT portion 715 through the gate electrode leads 705. Additionally in some embodiments the emitter contact metal layer 703 of the IGBT portion 701 is electrically coupled to the source contact metal layer 704 through the emitter contact leads 706. Similarly, the collector contact layer 711 of the IGBT portion 701 is electrically coupled to the drain contact layer 710 through the collector contact leads 707. This electrical coupling of areas of the two device portions allows the portions to operate together without sharing a common substrate or epitaxial layer. Specifically, the electrical coupling of the gate electrodes for the IGBT portion and the super-junction MOSFET portions means that during operation, IGBTs and Super-junctions MOSFETS with closely similar gate voltage thresholds will operate in synchronized fashion when switching to the 'on' state. Additionally the IGBT portion 701 and the Super-junction MOSFET portion 701 may be structurally coupled by way of being for example and without limitation, in the same integrated circuit package, on the same printed circuit board, or attached to the same surface.

Function

Figures 8A, 8B:
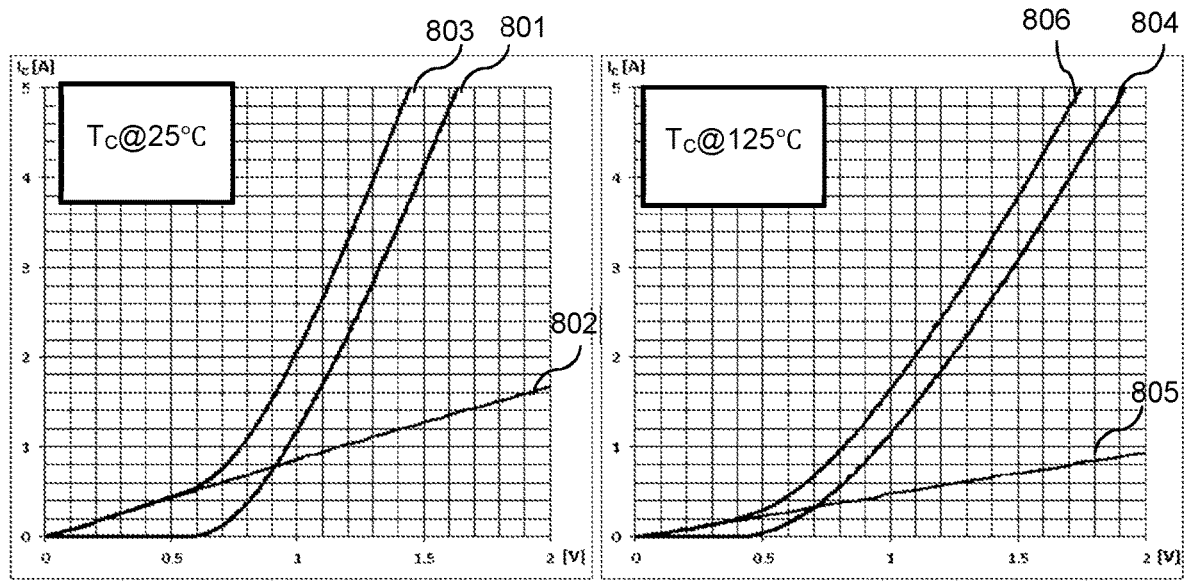
FIG. 8A is a current vs voltage line graph showing the function of the IGBT structurally coupled to a super-junction MOSFET device at 25 C according to aspects of the present disclosure.
FIG. 8B is a current vs voltage line graph showing the function of the IGBT structurally coupled to a super-junction MOSFET device at 125 C according to aspects of the present disclosure.

FIG. 8A shows the function of the IGBT structurally coupled to a super-junction MOSFET at 25 C 803 according to aspects of the present disclosure. Also shown is the function of a lone IGBT 801 and a lone Super-junction MOSFET 802. The graphs of FIGS. 8A and 8B show current vs voltage for the different devices. As discussed above, the lone IGBT curve 801 exhibits a diode like voltage threshold where the current conducted across the device does not rise until the voltage is ~0.6 Volts at 25 C. At 125 C, the current through the lone IGBT 804 does not rise until ~0.45 volts. The lone Super-junction MOSFET curve 802 on the other hand shows a linear rise in current conducted across the device starting at 0 volts. Similarly at 125 C the rise in current through the lone super-junction device has linear characteristics 805 and is flatter than the curve at 25 C 802. On the other hand after the voltage threshold the lone IGBT at both 25 C 801 and 125 C 804 device exhibits non-linear behavior. This behavior can be interpreted as the majority of current being conducted through the Super-junction MOSFET at currents below 0.6-1 amps and due to the non-linear behavior of the IGBT at currents above 0.6-1 amps, the majority of current is conducted through the IGBT portion of the device.

The IGBT structurally coupled and electrically coupled to a super-junction MOSFET curve 803 exhibits behavior of both a lone IGBT and a lone Super-junction MOSFET. As shown, the device exhibits linear behavior at low voltages, below 0.6 volts at 25 C and below 0.4 volts at 125 C. At higher voltages the device exhibits a non-linear relationship between current and voltages, this non-linear relationship persists from 25 C 803 to 125 C 806. Thus the curves clearly show that the IGBT structurally coupled and electrically coupled to a super-junction MOSFET resolves the voltage threshold problem in prior art IGBT devices because at >0 volts the device begins to conduct current. The device also maintains the positive aspects of the IGBTs because after the voltage threshold, the device exhibits the typical non-linear IGBT behavior.

Figure 9A:
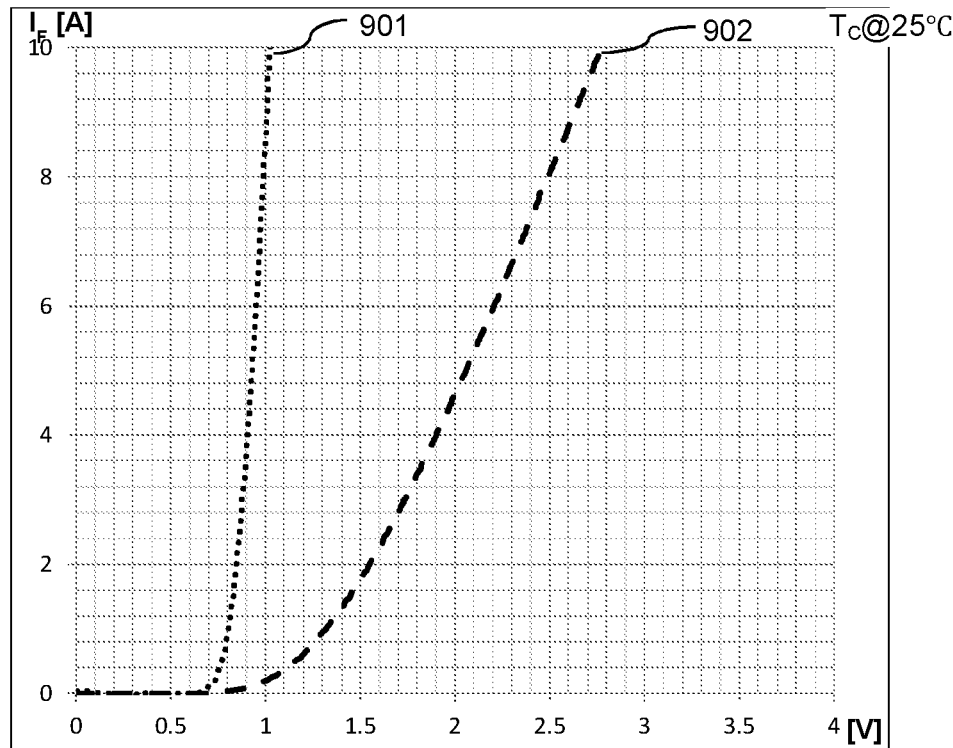
FIG. 9A is a current vs voltage line graph showing the function in the reverse current reverse bias direction of the IGBT structurally coupled to a super-junction MOSFET device at 25 C according to aspects of the present disclosure.
Figure 9B:
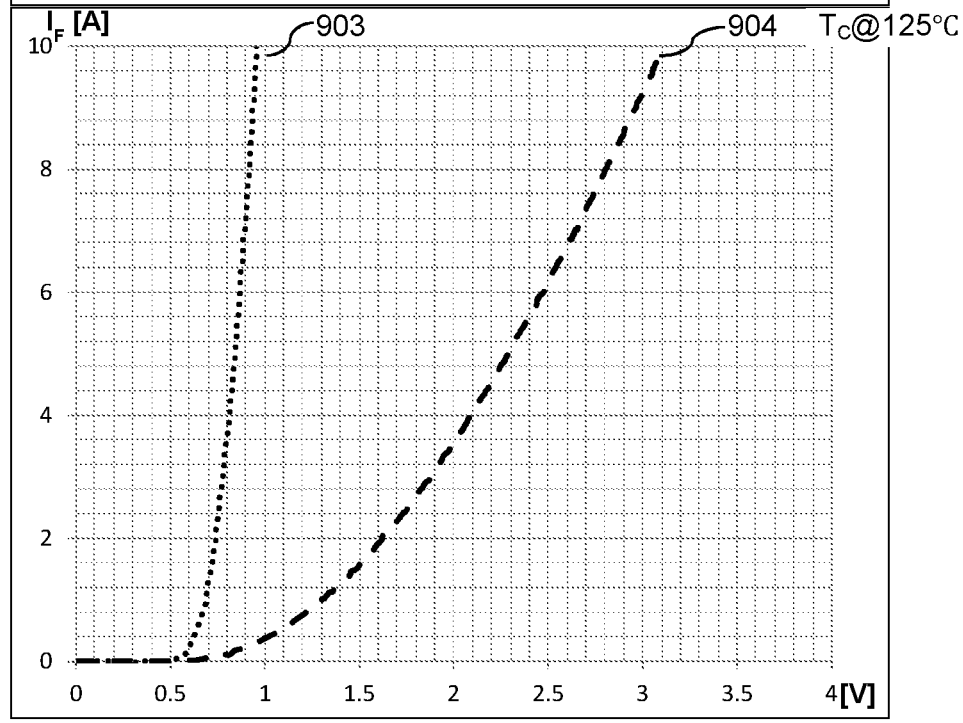
FIG. 9B is a current vs voltage line graph showing the function in the reverse current reverse bias direction of the IGBT structurally coupled to a super-junction MOSFET device at 125 C according to aspects of the present disclosure.

FIGS. 9A and 9B show the reverse current and reverse bias function of the IGBT structurally coupled and electrically coupled to a super-junction MOSFET current vs voltage curves at 25 C 901 and 125 C 903 respectively according to aspects of the present disclosure. The current vs voltage graphs also show the function of a normal IGBT co-packaged with an anti-parallel Fast Recovery Diode at 25 C 902 and 125 C 904. The graph shows that for a normal IGBT 902 at low voltages, no current is conducted across the device. The curve indicates that in the reverse bias and reverse current direction conductance across the device is dominated by conductance through the body diode of the super-junction MOSFET portion of the device. The body diode of the super-junction MOSFET could be considered acting as a freewheeling diode for the device. Thus, the device also fulfills the need for a freewheeling diode in lone IGBT devices and has lower conduction losses compared to co-packaged FRD.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An apparatus, comprising: an insulated gate bipolar transistor (GBT) having a gate comprising a gate insulating layer formed on top of a first shield electrode extending into a drift region of a first conductivity type, the insulated gate bipolar transistor further having an implanted layer of a second conductivity type opposite the first conductivity type, a buffer layer of the first conductivity type between the drift region and the implanted region and a lightly doped layer of either the first conductivity type or the second conductivity type between the buffer region and the implanted region; and a super-junction metal-oxide semiconductor field effect transistor (SJ-MOSFET) having a drift region of the first conductivity type, a heavily doped bottom layer of a first conductivity type, wherein the drift region is of the first conductivity type, wherein the IGBT and the SJ-MOSFET are structurally coupled by a common substrate, wherein an emitter of the insulated gate bipolar transistor and a source of the super-junction metal-oxide semiconductor field effect transistor are conductively coupled by a contact metal, wherein a collector of the insulated gate bipolar transistor and a drain of the super-junction metal-oxide semiconductor field effect transistor are conductively coupled by a backside contact.

2. The apparatus of claim 1, wherein a gate of the IGBT and a gate of the SJ-MOSFET are conductively coupled.

3. The apparatus of claim 1 wherein a body diode of the MOSFET is anti-parallel to the IGBT.

4. The apparatus of claim 1 wherein in an "on" state at currents less than 1-2 Amps the majority of charge is conducted through the SJ-MOSFET.

5. The apparatus of claim 1 wherein in an "on" state at currents greater than 1-2 Amp the majority of charge is conducted through the IGBT.

6. The apparatus of claim 1 wherein the SJ-MOSFET includes a fast recovery body diode.

7. The apparatus of claim 6 wherein the fast recovery body diode is created by bombarding the SJ-MOSFET with electrons before packaging.

8. The apparatus of claim 1 wherein the SJ-MOSFET acts as a freewheeling diode.

9. The apparatus of claim 1 wherein the IGBT is a planar gate insulated gate bipolar transistor.

10. The apparatus of claim 1 wherein the insulated gate bipolar transistor and the super-junction metal-oxide semiconductor field effect transistor are configured to have gate source thresholds that are within ±2 Volts of each other.

11. The apparatus of claim 1 wherein the insulated gate bipolar transistor is arranged parallel with the super-junction metal-oxide semiconductor field effect transistor.

12. The apparatus of claim 1 wherein super-junction metal-oxide semiconductor field effect transistor structures are interspersed between insulated gate bipolar transistor structures in the common substrate.

13. The apparatus of claim 1 wherein the insulated gate bipolar transistor shares a drift region with the super-junction metal-oxide semiconductor field effect transistor and wherein the shared drift region is at a same doping concentration for both the insulated gate bipolar transistor and the super-junction metal-oxide semiconductor field effect transistor.

14. The apparatus of claim 1 wherein the insulated gate bipolar transistor includes a second shield electrode between adjacent gates.

15. The apparatus of claim 1, wherein a bottom of the drift region in the IGBT is position higher than a bottom of the drift region in the SJ-MOSFET.

16. The apparatus of claim 1 wherein there are a plurality of body regions, and doped columns and wherein the plurality of doped columns are extend into the drift region and wherein the body regions and doped columns have a same conductivity type.

* * * * *